United States Patent
Otsuka (10) Patent No.: US 7,528,749 B2
(45) Date of Patent: May 5, 2009

(54) DECODING APPARATUS AND DECODING METHOD

(75) Inventor: Katsumi Otsuka, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/927,892

(22) Filed: Oct. 30, 2007

(65) Prior Publication Data

US 2008/0100479 A1   May 1, 2008

(30) Foreign Application Priority Data

Nov. 1, 2006   (JP) .............................. 2006-298211

(51) Int. Cl.
 *H03M 7/00* (2006.01)
(52) U.S. Cl. .......................... 341/107; 341/50; 341/51; 341/65
(58) Field of Classification Search ................. 341/107, 341/51, 50, 65; 714/752
 See application file for complete search history.

(56) References Cited

U.S. PATENT DOCUMENTS

| 6,557,137 | B1 * | 4/2003 | Park et al. .................. 714/752 |
| 6,940,429 | B2 | 9/2005 | Sankaran |
| 2004/0117714 | A1 | 6/2004 | Marpe et al. |
| 2006/0017591 | A1 | 1/2006 | Bossen |

FOREIGN PATENT DOCUMENTS

| JP | 11-103257 | 4/1999 |
| JP | 2005-130099 | 5/2005 |

OTHER PUBLICATIONS

U.S. Appl. No. 11/927,926, filed Oct. 30, 2007, Katsumi Otsuka.
Series H: Audiovisual and Multimedia Systems; Infrastructure of Audiovisual Services—Coding of moving video: Advanced video coding for generic audiovisual services, ITU-T Recommendation H.264 | ISO/IEC 14496-10 AVC, approved Mar. 2005 http://www.itu.int/rec/T-REC-H.264/en.
Series H: Audiovisual and Multimedia Systems; Infrastructure of Audiovisual Services—Coding of moving video: Reference software for H.264 advanced video coding, H.264 Reference Software Joint Model ver9.0, approved Mar. 2005 http://www.itu.int/rec/T-REC-H.264.2/en.

* cited by examiner

*Primary Examiner*—Jean B Jeanglaude
(74) *Attorney, Agent, or Firm*—Cowan, Liebowitz & Latman, P.C.

(57) ABSTRACT

A decoding apparatus for arithmetically decoding input coded data into symbol data by using a state variable and a context variable includes: a first decoding unit executes arithmetic decoding processing by using the state variable and the context variable and outputs first symbol data, and outputs the state variable and the context variable, which are updated by the arithmetic decoding processing, as a first state variable and a first context variable; and a second decoding unit executes arithmetic decoding processing by using the first state variable and the first context variable and outputs second symbol data, and outputs the first state variable and the first context variable, which are updated by the arithmetic decoding processing, as a second state variable and a second context variable. Whether to employ the second symbol data as a decoding result is determined based on the value of the first state variable.

5 Claims, 12 Drawing Sheets

| STEPS IN FIG. 11 | BLOCKS IN FIG. 2 |
|---|---|
| STEP S402 | codIRange UPDATER 501 |
| STEP S403 | COMPARATOR 502<br>SELECTOR 505 |
| STEP S404 | MPS PROCESSOR 504 |
| STEP S405<br>STEP S408 | LPS PROCESSOR 503 |
| STEP S406<br>STEP S407 | LOGIC INVERTING ELEMENT 507<br>SELECTOR 506 |

| codIRange | SHIFT AMOUNT (BITS) |
|---|---|
| 1_XXXX_XXXX | 0 |
| 0_1XXX_XXXX | 1 |
| 0_01XX_XXXX | 2 |
| 0_001X_XXXX | 3 |
| 0_0001_XXXX | 4 |
| 0_0000_1XXX | 5 |
| 0_0000_01XX | 6 |
| 0_0000_001X | 7 |
| 0_0000_0001 | 8 |

FIG. 6

| SHIFT AMOUNT (BITS) | EXTRACTED CODED DATA |
|---|---|
| 0 | "0_0000_0000" |
| 1 | "0000_0000"&Cin[7] |
| 2 | "0000_000"&Cin[7:6] |
| 3 | "0000_00"&Cin[7:5] |
| 4 | "0000_0"&Cin[7:4] |
| 5 | "0000"&Cin[7:3] |
| 6 | "000"&Cin[7:2] |
| 7 | "00"&Cin[7:1] |
| 8 | "0"&Cin[7:0] |

DECODING APPARATUS AND DECODING METHOD

BACKGROUND OF THE INVENTION

1. Field of the Invention

The present invention relates to a decoding apparatus and decoding method. The present invention particularly relates to speedup of entropy coding/decoding processing as a compression scheme used to encode a moving image or still image. The present invention is particularly suitable for arithmetic decoding processing as an entropy decoding method.

2. Description of the Related Art

Recently, the H.264 (ITU-T Rec.H.264|ISO/IEC 14496-10 AVC) coding scheme has been standardized in joint video team (JVT). The H.264 handles image information as digital data, like JPEG known as a still image coding scheme and MPEG-2 or MPEG-4 (version 2) known as a moving image coding scheme. Particularly in the moving image coding scheme, compression using hybrid coding is executed to reduce redundant information between frames (in the temporal direction) and redundant information of pixels in a frame (in the spatial direction), aiming at efficient information transmission and storage. This hybrid coding uses entropy coding together with orthogonal transform such as discrete cosine transform and motion-compensation. Entropy coding is a technique of executing variable length coding using uneven distribution of information.

As entropy coding used in the H.264, Context-based Adaptive Variable Length Coding (CAVLC) using Huffman coding or Context-Adaptive Binary Arithmetic Coding (CABAC) using arithmetic coding is defined in accordance with the profile. CAVLC is selected in a baseline profile which includes coding tools with low process complexity for a communication application. CABAC is selected in a main profile or high profile that places focus on the coding efficiency.

Figure 10:
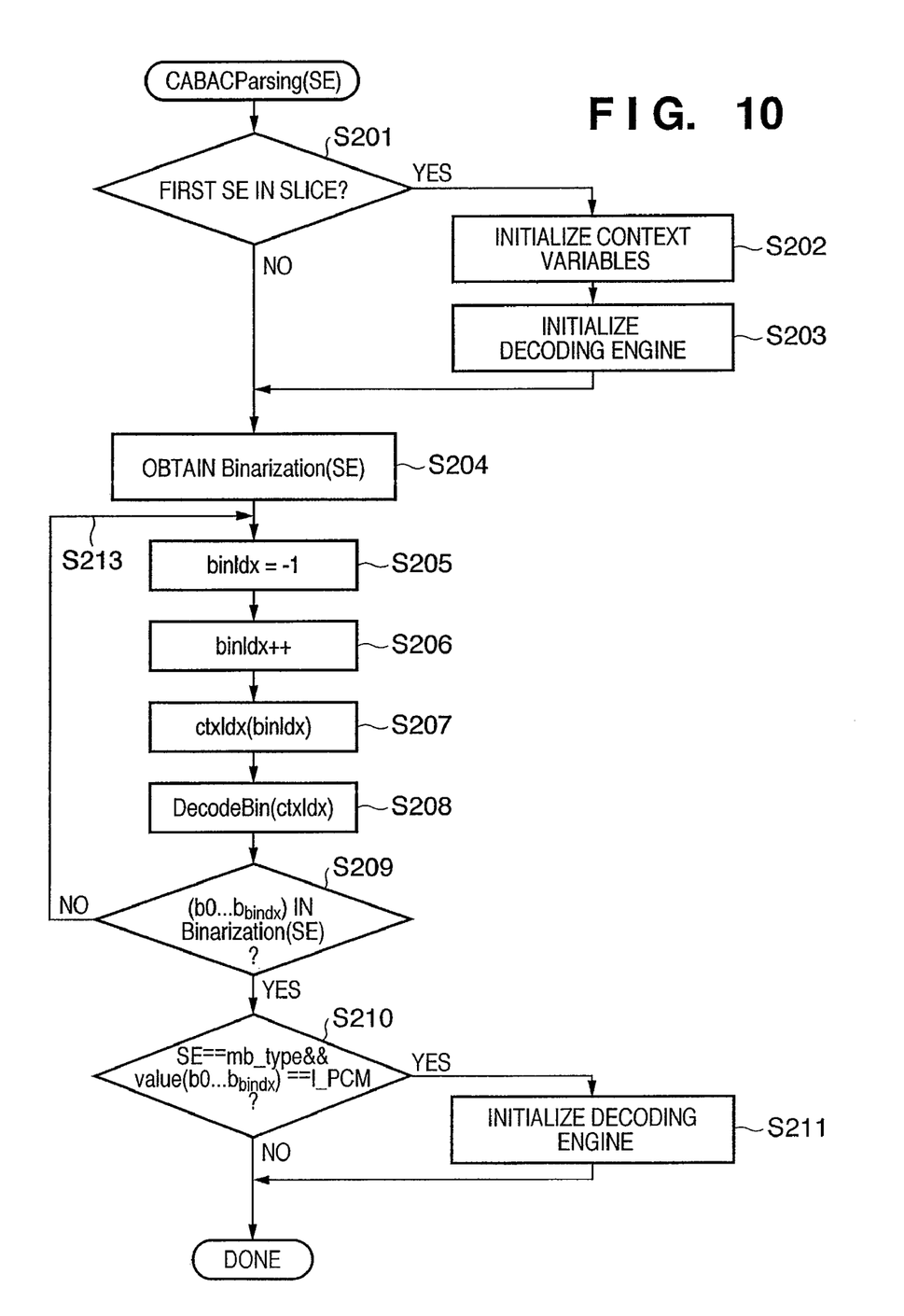
FIG. 10 is a flowchart illustrating CABAC decoding processing CABACParsing( )
Figure 11:
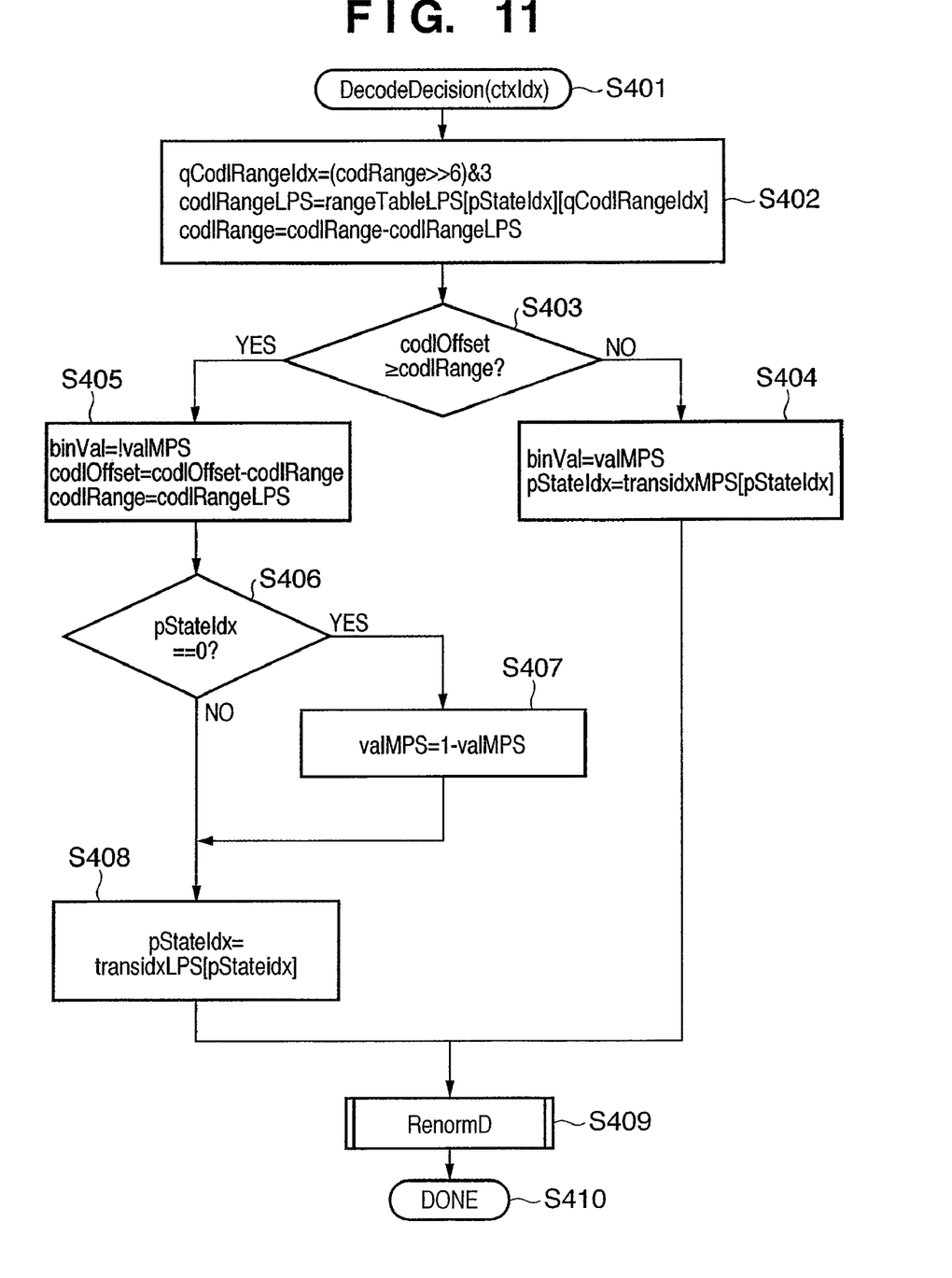
FIG. 11 is a flowchart of DecodeDecision( ) in the CABAC decoding processing.
Figure 12:
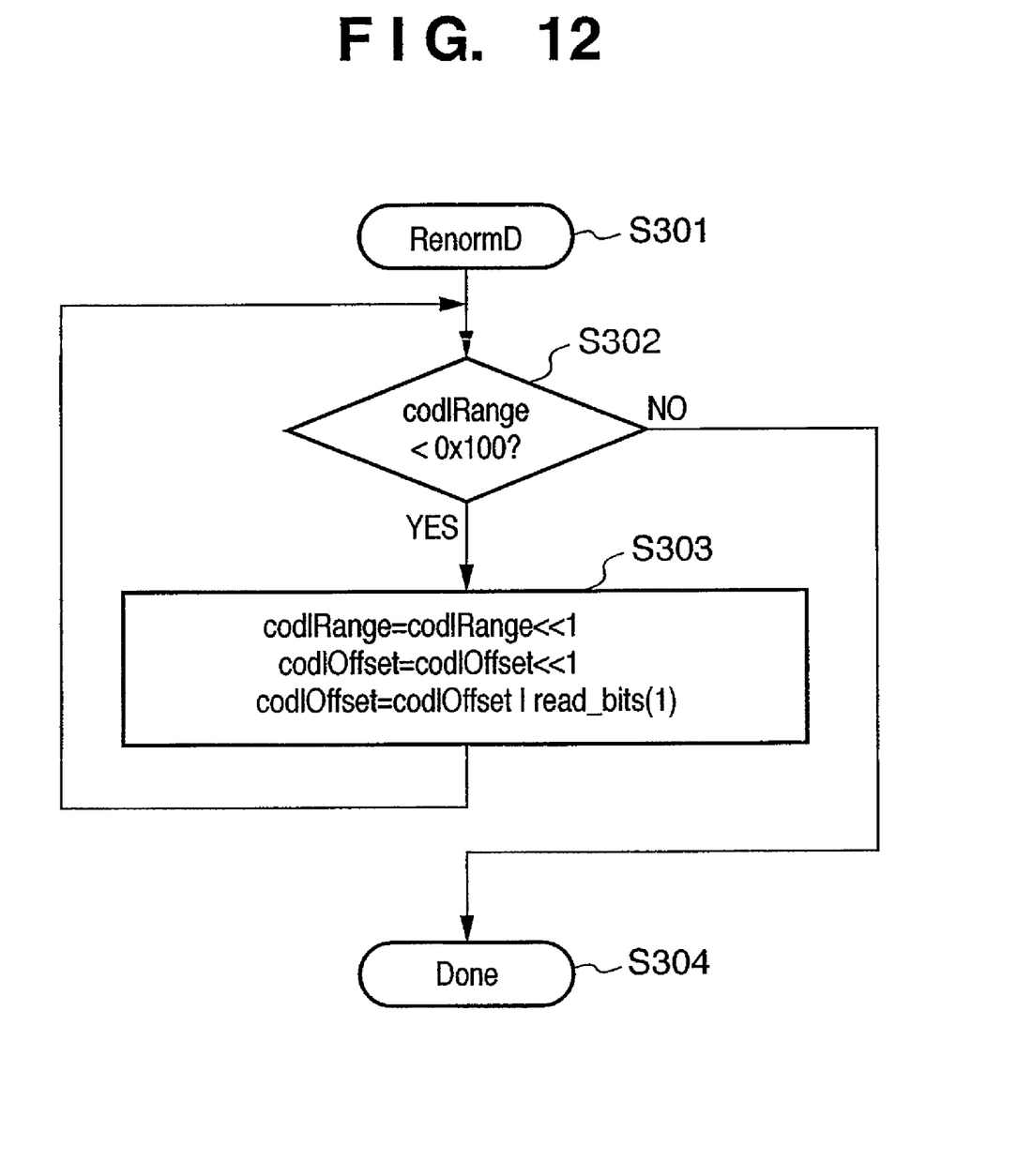
FIG. 12 is a flowchart of RenormD( ) in the CABAC decoding processing.

As is generally known, arithmetic coding implemented by software or hardware is difficult to speed up as compared to variable length coding such as Huffman coding or Golomb coding. FIG. 10 is a flowchart of CABAC decoding processing described in, for example, the H.264 recommendation (ITU-T Rec.H.264|ISO/IEC 14496-10 AVC). This decoding processing is hard to speed up because a process loop S213 of CABACParsing(SE) processing in FIG. 10 is executed for every bit (symbol). FIGS. 11 and 12 respectively show arithmetic decoding processing and re-normalization processing disclosed in "H.264 Reference Software Joint Model ver9.0". Note that DecodeBin(ctxIdx) (S208 in FIG. 10) includes DecodeDecision(ctxIdx) as arithmetic coding and DecodeBypass as fixed length encoding. The simple DecodeBypass processing is omitted here. The processes shown in FIGS. 11 and 12 are DecodeDecision(ctxIdx). Using the value of a state variable obtained by the arithmetic decoding processing shown in FIG. 11, the CABAC re-normalization processing shown in FIG. 12 updates the value of the state variable itself and also obtains the number of bits to be removed from the top of received coded data. That is, before the current target symbol undergoes all processes shown in FIGS. 11 and 12, decoding of the next symbol cannot start.

The CABAC scheme performs encoding/decoding in units of symbols generated by binarizing a syntax element of a coding target in advance. More specifically, the CABAC scheme generates a plurality of symbols from one syntax element, unlike Huffman coding in which one syntax element corresponds to one symbol. For this reason, the CABAC requires a much longer process time for coding/decoding processing than the CAVLC using Huffman coding.

Japanese Patent Laid-Open Nos. 11-103257 and 2005-130099 disclose techniques of implementing an arithmetic decoding apparatus by hardware. These techniques smoothly arithmetically encode symbol data in correspondence with each clock by executing a pipeline operation of address generation in a context memory for holding a state and calculations in arithmetic coding.

Along with the recent rapid increase in the resolution represented by high-resolution images, a demand for coding and decoding apparatuses capable of high-speed processing has arisen. In hybrid coding represented by H.264, in particular, a factor that decides the processing speed of an entire decoding apparatus is speedup of an entropy decoding apparatus.

However, even when the technique disclosed in Japanese Patent Laid-Open No. 11-103257 or 2005-130099 is used, only one symbol is decodable in one cycle at maximum. It is difficult to execute the decoding processing at a higher speed.

For example, even if two arithmetic decoding units operate in parallel to increase the processing speed, decoding of the second symbol cannot start unless decoding of the first symbol completely finishes. It is therefore difficult to execute the two arithmetic decoding units in one cycle.

SUMMARY OF THE INVENTION

According to an exemplary embodiment of the present invention, there is provided an arrangement capable of causing two arithmetic decoding units to simultaneously output symbols. It is therefore possible to speed up decoding processing.

According to one aspect of the present invention, there is provided a decoding apparatus for arithmetically decoding input coded data into symbol data by using a state variable and a context variable, comprising:

a first decoding unit which executes arithmetic decoding processing by using the state variable and the context variable and outputs first symbol data, and outputs the state variable and the context variable, which are updated by the arithmetic decoding processing, as a first state variable and a first context variable;

a second decoding unit which executes arithmetic decoding processing by using the first state variable and the first context variable and outputs second symbol data, and outputs the first state variable and the first context variable, which are updated by the arithmetic decoding processing, as a second state variable and a second context variable; and a determination unit which determines on the basis of a value of the first state variable whether to employ the second symbol data as a decoding result.

According to another aspect of the present invention, there is provided a decoding method of arithmetically decoding input coded data into symbol data by using a state variable and a context variable, comprising:

a first decoding step of executing arithmetic decoding processing by using the state variable and the context variable and outputting first symbol data, and outputting the state variable and the context variable, which are updated by the arithmetic decoding processing, as a first state variable and a first context variable;

a second decoding step of executing arithmetic decoding processing by using the first state variable and the first context variable and outputting second symbol data, and outputting the first state variable and the first context variable, which are updated by the arithmetic decoding processing, as a second state variable and a second context variable; and a determination step of determining on the basis of a value of the first state variable whether to employ the second symbol data as a decoding result.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Figure 1:
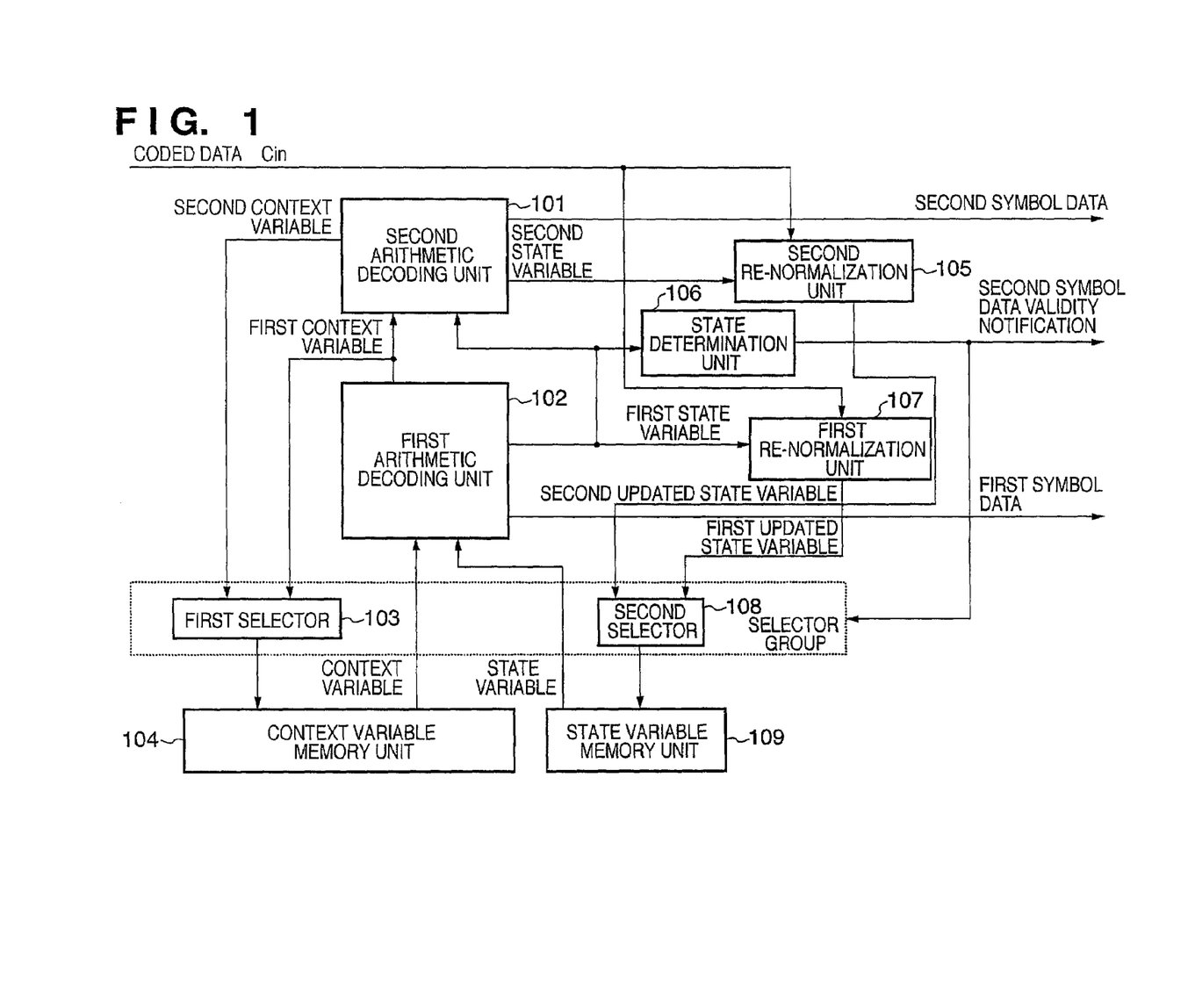
FIG. 1 is a block diagram showing an arrangement example of an entropy decoding apparatus (arithmetic decoding apparatus) according to an embodiment.

FIG. 1 is a block diagram showing the arrangement of an entropy decoding apparatus (arithmetic decoding apparatus) according to the embodiment. The arithmetic decoding apparatus of this embodiment entropy-decodes coded data obtained by CABAC coding as an entropy coding method based on H.264.

A context variable memory unit 104 stores a value MPS of a most probable symbol as a context variable corresponding to a context index defined in the H.264 recommendation (ITU-T Rec.H.264|ISO/IEC 14496-10 AVC), and pStateIdx representing a probability state. A state variable memory unit 109 stores decoding engine state variables (to be referred to as state variables hereinafter) codIRange and codIOffset. The context variables and state variables are input to a first arithmetic decoding unit 102.

Figure 2:
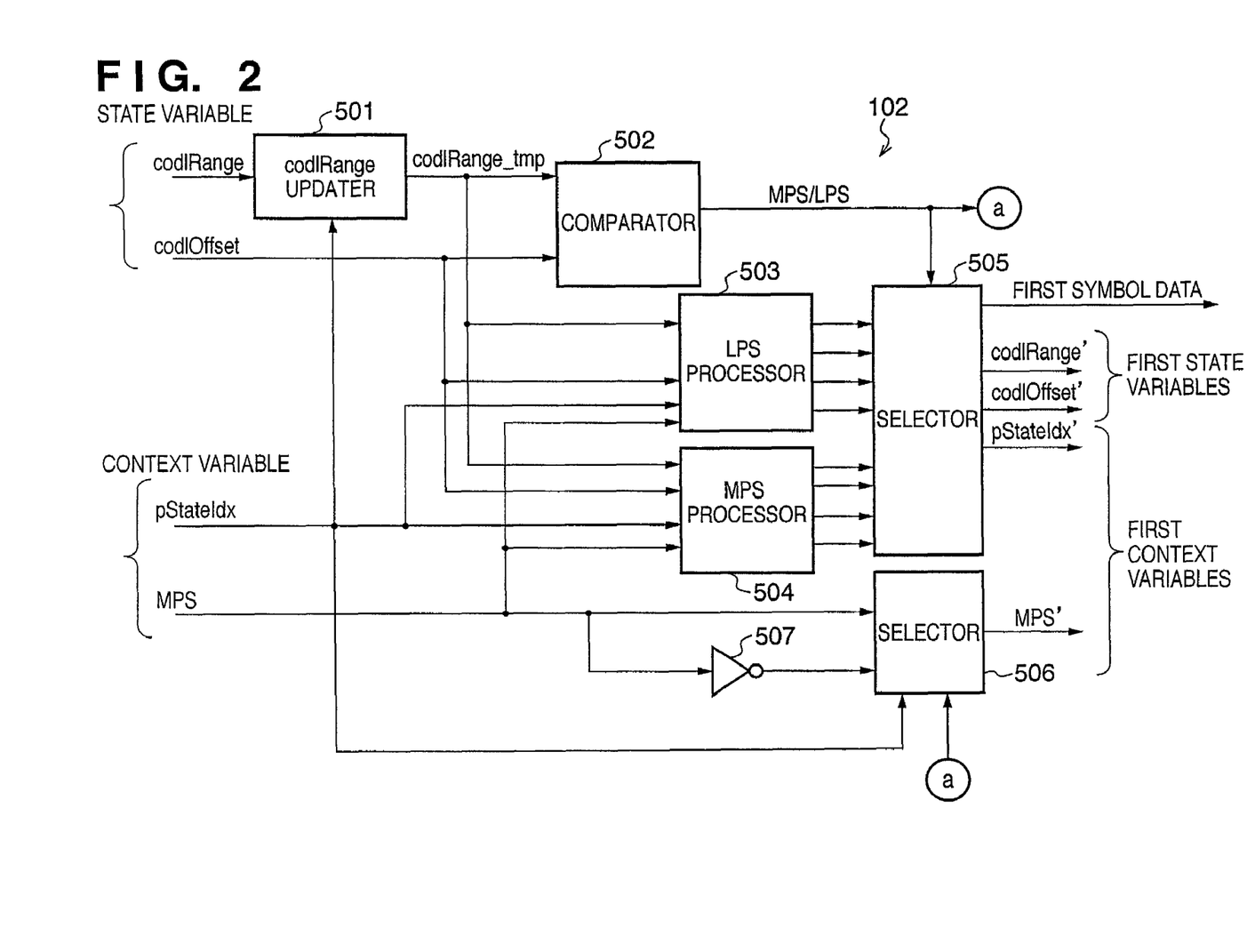
FIG. 2 is a block diagram showing an arrangement example of a first arithmetic decoding unit 102 implemented by hardware.
Figure 3:
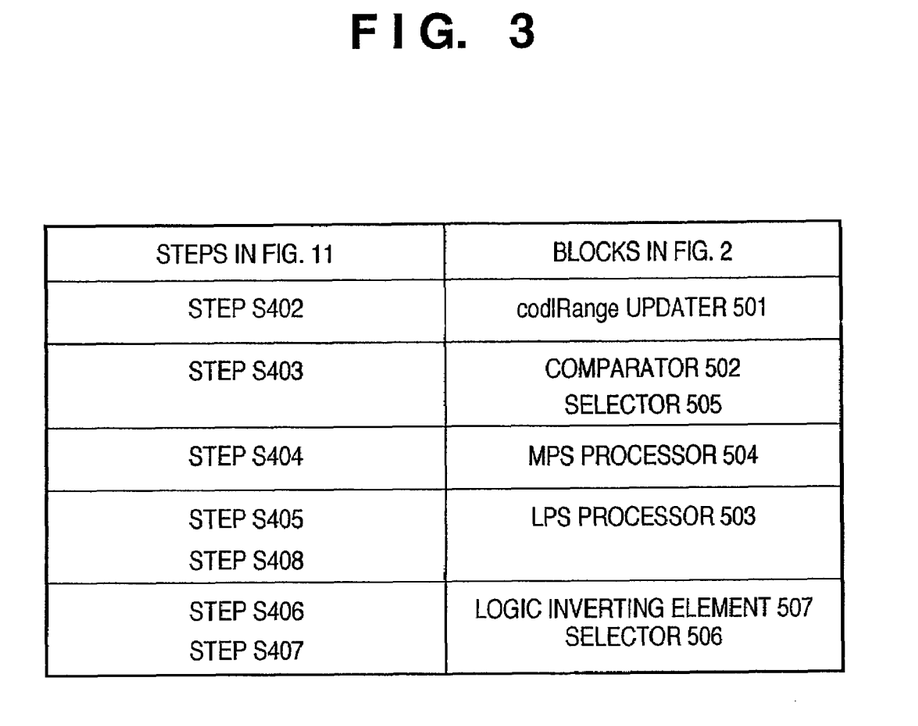
FIG. 3 is a table showing the correspondence between the blocks in FIG. 2 and the process steps in FIG. 11.

Processing executed by the first arithmetic decoding unit 102 described in the H.264 recommendation is shown in the flowchart of FIG. 11. FIG. 2 is a block diagram showing an arrangement example of the first arithmetic decoding unit 102 implemented by hardware. FIG. 3 shows the correspondence between the blocks in FIG. 2 and the process steps in FIG. 11.

A codIRange updater 501 updates the state variable codIRange by using the state variable codIRange from the state variable memory unit 109 and the context variable pStateIdx from the context variable memory unit 104 and outputs codIRange_tmp. More specifically, the codIRange updater 501 acquires codIRangeLPS from a table (rangeTableLPS) based on the values of the seventh and eighth bits of the received codIRange. The codIRange updater 501 acquires the updated codIRange, that is, codIRange_tmp by subtracting the acquired codIRangeLPS from the received codIRange, and outputs the codIRange_tmp. The above-described processing corresponds to step S402 in FIG. 11.

A comparator 502 compares the value of the updated codIRange (codIRange_tmp) with the state variable codIOffset input to the first arithmetic decoding unit 102 and sends the comparison result to a selector 505 (step S403). More specifically, if codIOffset<codIRange_tmp, the comparator 502 sends an MPS signal to the selector 505. If codIOffset≧codIRange_tmp, the comparator 502 sends an LPS signal to the selector 505.

An LPS processor 503 acquires codIOffset' updated based on the updated state variable codIRange_tmp and the state variable codIOffset input to the first arithmetic decoding unit 102. More specifically, the LPS processor 503 acquires the updated codIOffset' by calculating (codIOffset−codIRange_tmp) and outputs the codIOffset' to the selector 505. The LPS processor 503 also acquires the codIRangeLPS from the codIRange updater 501 and outputs it to the selector 505 as updated codIRange'. The LPS processor 503 also acquires pStateIdx corresponding to the received pStateIdx from a table transidxLPS for updating the probability state and outputs the pStateIdx as updated pStateIdx'. The LPS processor 503 also inverts the received most probable symbol MPS to !MPS and outputs it as first symbol data. The above-described processing of the LPS processor 503 corresponds to steps S405 and S408.

An MPS processor 504 outputs the codIRange_tmp from the codIRange updater 501 and the codIOffset input to the first arithmetic decoding unit 102 directly to the selector 505 as codIRange' and codIOffset'. The MPS processor 504 also acquires pStateIdx corresponding to the received pStateIdx from a table transidxMPS for updating the probability state and outputs the pStateIdx as updated pStateIdx'. The MPS processor 504 also outputs the received most probable symbol MPS directly to the selector 505 as first symbol data. The above-described processing corresponds to step S404.

If the comparison result output from the comparator 502 is an MPS signal, the selector 505 selects the codIRange', codIOffset', pStateIdx' and first symbol data (MPS) output from the MPS processor 504 and outputs them. On the other hand, if the comparison result output from the comparator 502 is an LPS signal, the selector 505 selects the codIRange', codIOffset', pStateIdx' and first symbol data (!MPS) output from the LPS processor 503 and outputs them. The codIRange' and codIOffset' output from the selector 505 will be referred to as first state variables. The above-described processing corresponds to steps S403 to S408.

According to the above-described operation, if codIOffset≧codIRange_tmp, a value (!MPS) obtained by inverting the value of the received MPS is set to a variable binVal and output as first symbol data in step S405. If codIOffset<codIRange_tmp, the value of the received MPS is directly set to the variable binVal and output as first symbol data in step S404.

A selector 506 selects the received MPS or an MPS inverted by an inverter 507 based on the received pStateIdx and the comparison result output from the comparator 502. If the comparison result output from the comparator 502 is an MPS signal, the selector 506 selects the MPS and outputs it as MPS' (step S404). If the comparison result output from the comparator 502 is an LPS signal, the selector 506 switches the selection in accordance with the value of pStateIdx. If the comparison result output from the comparator 502 is an LPS signal, and pStateIdx=0, the selector 506 selects the output signal (inverted MPS) from the inverter 507 and outputs it as MPS' (steps S406 and S407). If the comparison result output from the comparator 502 is an LPS signal, and pStateIdx≠0, the selector 506 selects a non-inverted MPS and outputs it as MPS'.

The pStateIdx' output from the selector 505 and the MPS' output from the selector 506 will be referred to as first context variables.

The internal arrangement of a second arithmetic decoding unit 101 is the same as that shown in FIG. 2 except that the second arithmetic decoding unit 101 uses, as inputs, the first context variables (pStateIdx' and MPS') and first state variables (codIRange' and codIOffset') output from the first arithmetic decoding unit 102. The second arithmetic decoding unit 101 outputs second symbol data, second state variables, and second context variables.

Figure 4:
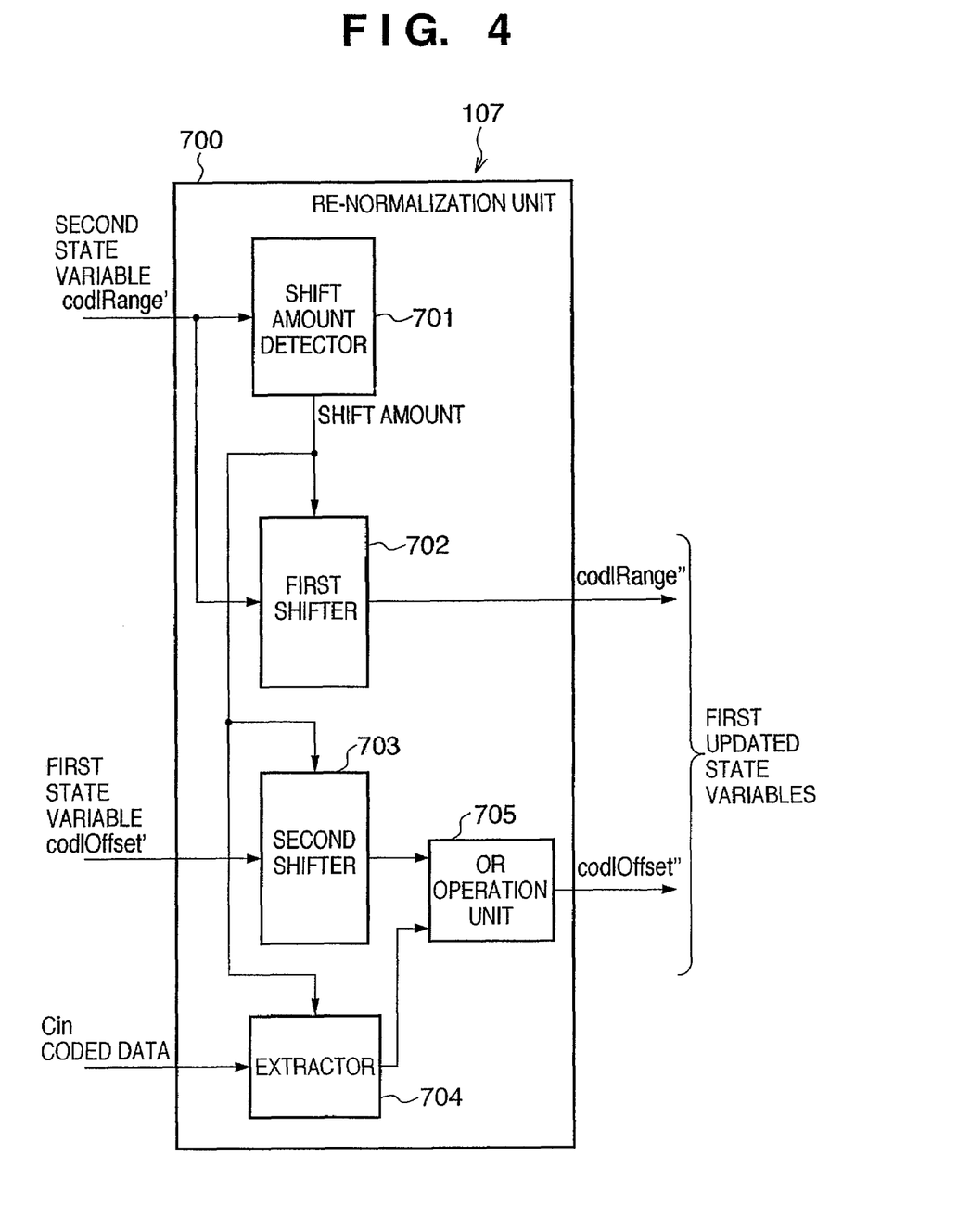
FIG. 4 is a block diagram showing the arrangement of a first re-normalization unit according to the embodiment.

A first re-normalization unit 107 will be described next. FIG. 4 is a block diagram showing the arrangement of the first re-normalization unit 107 of this embodiment. The first re-normalization unit 107 receives coded data and the first state variables output from the first arithmetic decoding unit 102 and outputs first updated state variables.

Figure 5:
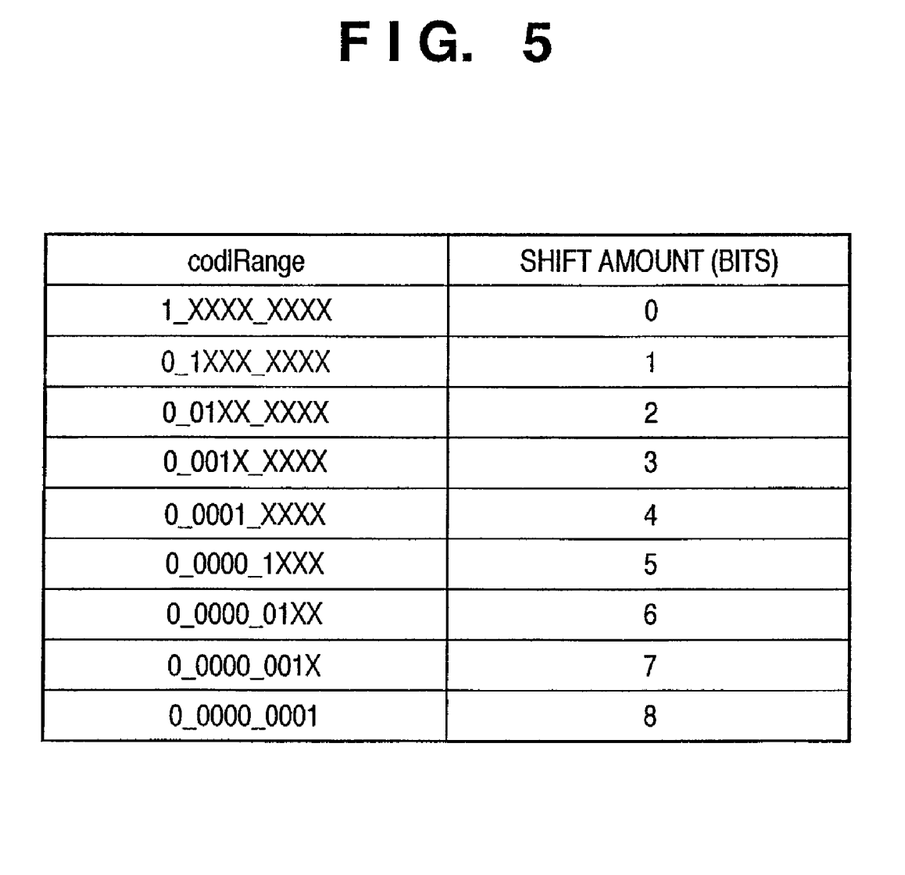
FIG. 5 is a table for explaining the processing of a shift amount detector according to the embodiment.

A shift amount detector 701 detects, from the received codIRange', a shift amount to be supplied to a first shifter 702, second shifter 703, and extractor 704. The shift amount detector 701 detects the shift amount by detecting a bit position where a bit value "1" appears for the first time from the MSB to LSB of the received 9-bit codIRange'. FIG. 5 is a table for explaining the processing of the shift amount detector 701. The value of a bit expressed by X in the table can have either 0 or 1.

The first shifter 702 shifts the received codIRange' to the left by bits in number corresponding to the shift amount output from the shift amount detector 701 and outputs the result as codIRange". The second shifter 703 shifts the received codIOffset' to the left by bits in number corresponding to the shift amount output from the shift amount detector 701 and outputs the result.

Figure 6:
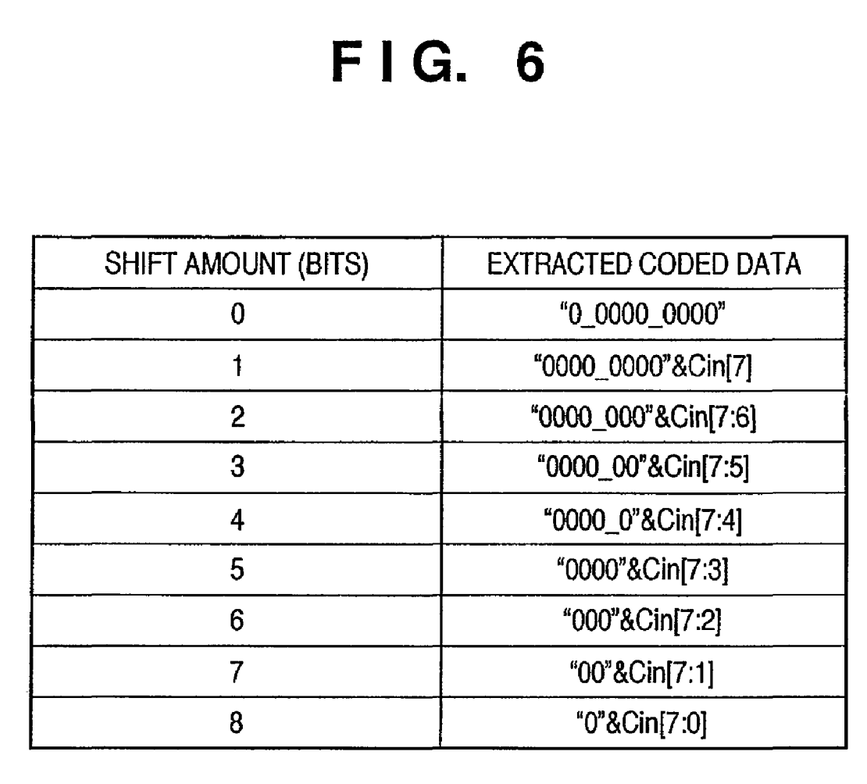
FIG. 6 is a table for explaining coded data extraction processing corresponding to a shift amount.

The extractor 704 extracts bits designated by the shift amount output from the shift amount detector 701 from the MSB of the received coded data (Cin). The extractor 704 outputs 9-bit data obtained by adding 0 to the left side (significant bit side) of the extracted data. FIG. 6 shows this situation. Referring to FIG. 6, for example, Cin[7:0] represents 8-bit data extracted from the MSB of the received coded data. Nine-bit data is generated by adding a "0" bit to the left side of the 8-bit data and output.

An OR operation unit 705 calculates the OR of the 9-bit data from the extractor 704 and a signal from the second shifter 703, which is obtained by shifting codIOffset' to the left, and outputs the result as codIOffset". The above described operations of the re-normalization unit 107 corresponds to the process loop of steps S302 and S303.

The codIRange" and codIOffset" output from the first re-normalization unit 107 are the first updated state variables shown in FIG. 1.

The internal arrangement of a second re-normalization unit 105 is the same as that of the first re-normalization unit 107 shown in FIG. 4 except that the second re-normalization unit 105 receives second state variables output from the first arithmetic decoding unit 102 and generates and outputs second updated state variables.

Figure 7:
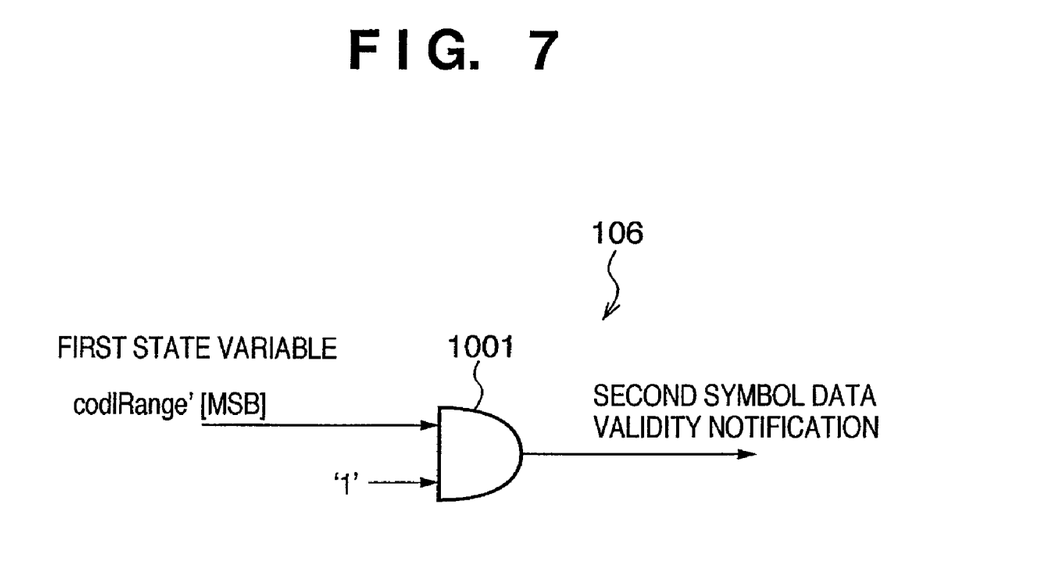
FIG. 7 is a block diagram showing an internal arrangement example of a state determination unit.

A state determination unit 106 will be described next. FIG. 7 shows an internal arrangement of the state determination unit 106. An AND circuit 1001 receives the MSB of the first state variable codIRange' and calculates the AND of the MSB and a value "1". If the MSB is 1, a value "1" representing that the second symbol data is valid is output. This corresponds to the case wherein the shift amount in the first re-normalization unit 107 is 0, as shown in FIG. 5.

Figure 8:
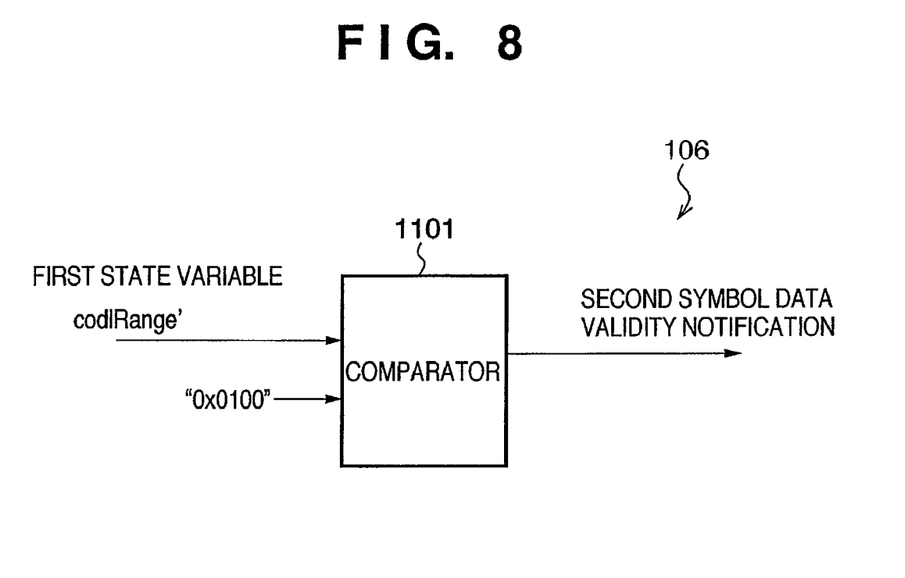
FIG. 8 is a block diagram showing another internal arrangement of the state determination unit.

FIG. 8 shows another implementation form of the state determination unit 106. In the arrangement shown in FIG. 8, a comparator 1101 compares the first state variable codIRange' with a constant value "0x0100". If it is determined that codIRange'≧"0x0100", the comparator 1101 outputs a value "1" representing that the second symbol data is valid. This also corresponds to the case wherein the shift amount in the first re-normalization unit 107 is 0, as shown in FIG. 5.

In both implementation forms in FIGS. 7 and 8, the value representing that the second symbol data is valid is output when the bit shift processing in step S303 of the re-normalization processing (RenormD) shown in FIG. 12 is not executed. Note that the MSB of the coded data may directly be used for the second symbol data validity notification of the state determination unit 106.

Figure 9:
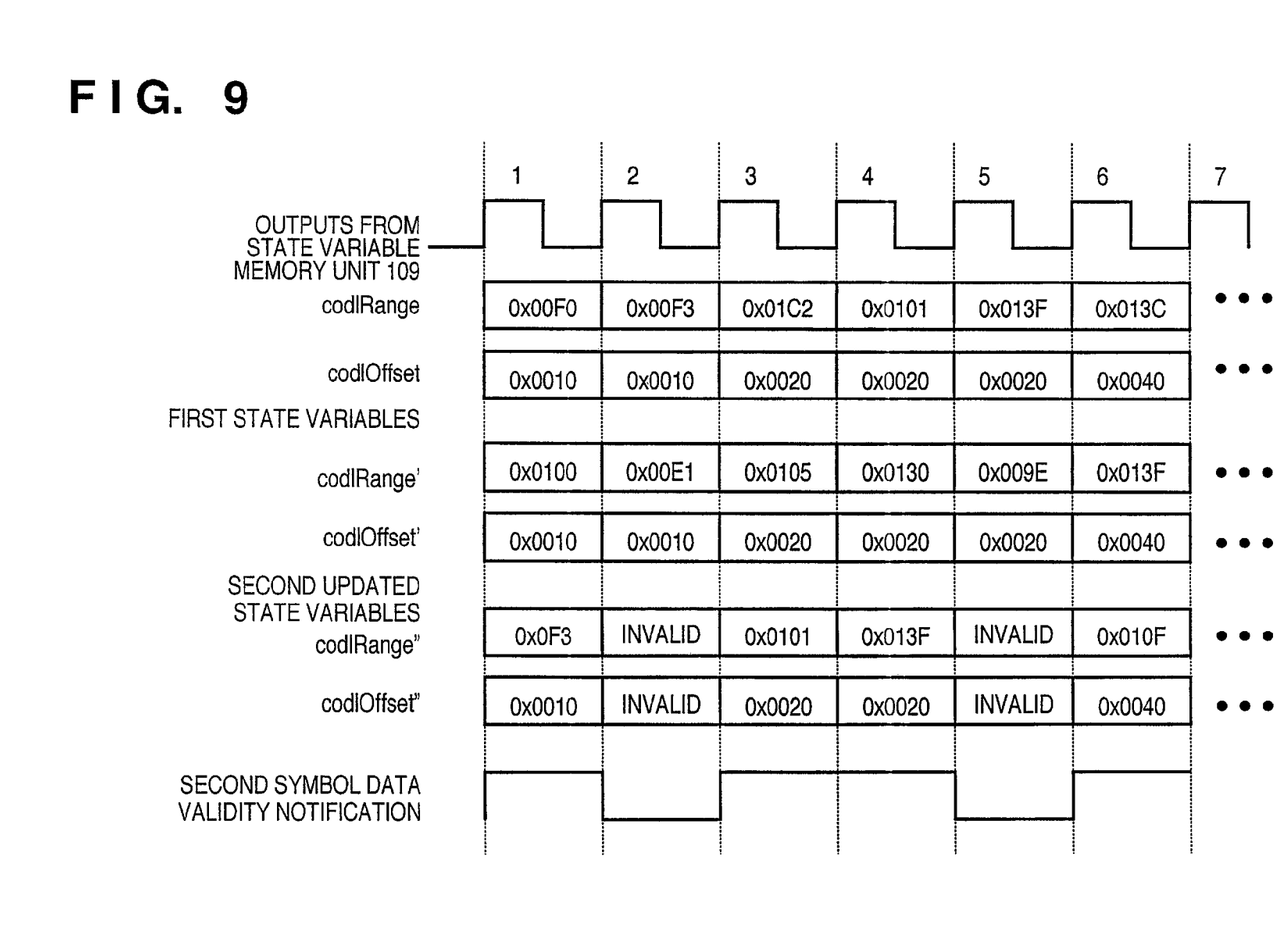
FIG. 9 is a timing chart of the entropy decoding apparatus according to the embodiment.

FIG. 9 is a timing chart of the entropy decoding apparatus according to this embodiment. In cycle 1, the value of the first state variable codIRange' is equal to or larger than 0x0100. Hence, the state determination unit 106 outputs the signal representing that the second symbol data output from the second arithmetic decoding unit 101 is valid. In cycle 2, the value of the first state variable codIRange' is smaller than 0x0100. Hence, the state determination unit 106 outputs a signal representing that the second symbol data is invalid.

When the state determination unit 106 outputs the signal representing the second symbol data is valid, a first selector 103 selects the second context variables output from the second arithmetic decoding unit 101 and writes them in the context variable memory unit 104. When the state determination unit 106 outputs the signal representing the second symbol data is invalid, the first selector 103 selects the first context variables output from the first arithmetic decoding unit 102 and writes them in the context variable memory unit 104. When the state determination unit 106 outputs the signal representing the second symbol data is valid, a second selector 108 selects the second updated state variables output from the second re-normalization unit 105 and writes them in the state variable memory unit 109. When the state determination unit 106 outputs the signal representing the second symbol data is invalid, the second selector 108 selects the first updated state variables output from the first re-normalization unit 107 and writes them in the state variable memory unit 109.

High-speed decoding processing can be done by repeating the above-described decoding processing for all symbol data in the syntax element.

As described above, the decoding apparatus of this embodiment has two systems: a first system including the first arithmetic decoding unit 102 and first re-normalization unit 107 and a second system including the second arithmetic decoding unit 101 and second re-normalization unit 105. Identical coded data are input to the first and second systems simultaneously in parallel. The first system is defined as the preceding stage, and the second system is defined as the succeeding stage. The preceding stage executes decoding processing from the top of a bit string. The succeeding stage executes decoding processing from a position shifted from the top of the bit string by a shift amount obtained from the result of the preceding stage. Whether to wait for decoding is determined based on the value of codIRange.

As described above, the decoding apparatus of this embodiment shown in FIG. 1 arithmetically decodes input coded data (Cin) into symbol data by using state variables and context variables. The apparatus has two decoding units, that is, the first arithmetic decoding unit 102 and second arithmetic decoding unit 101. The first arithmetic decoding unit 102 executes arithmetic decoding processing by using the state variables and context variables stored in the state variable memory unit 109 and context variable memory unit 104. The first arithmetic decoding unit 102 outputs first symbol data and outputs the state variables and context variables, which are updated by the arithmetic decoding processing, as first state variables and first context variables. The second arithmetic decoding unit 101 executes arithmetic decoding processing by using the first state variables and first context variables output from the first arithmetic decoding unit 102. The second arithmetic decoding unit 101 outputs second symbol data and outputs the first state variables and first context variables, which are updated by the arithmetic decoding processing, as second state variables and second context variables. The state determination unit 106 determines on the basis of the values of the first state variables from the first arithmetic decoding unit 102 whether to employ the output from the second arithmetic decoding unit 101. For example, the state determination unit 106 determines whether to employ the second symbol data as a decoding result.

In the above-described arrangement, the second arithmetic decoding unit 101 executes decoding processing by using the first state variables and first context variables from the first arithmetic decoding unit 102. That is, the second arithmetic decoding unit 101 can start decoding processing without waiting for output of the first updated state variables by re-normalization processing of the first state variables. That is, it is possible to execute the re-normalization processing by the first re-normalization unit 107 and the decoding processing by the second arithmetic decoding unit 101 in parallel. If the state determination unit 106 determines that the second symbol data is valid, the decoding result from both the first arithmetic decoding unit 102 and second arithmetic decoding unit 101 are used. Hence, the decoding processing speed increases.

In the above-described embodiment, the state variable memory unit 109 and context variable memory unit 104 which store the state variables and context variables and provide them to the first arithmetic decoding unit 102 are provided. The first re-normalization unit 107 executes re-normalization processing by using coded data and the first state variables and outputs the first updated state variables. The second re-normalization unit 105 executes re-normalization processing by using coded data and the second state variables and outputs the second updated state variables. The first selector 103 selects the first context variables or second context variables based on the determination result of the state determination unit 106 and records the selected context variables in the context variable memory unit 104. The second selector 108 selects the first updated state variables or second updated state variables based on the determination result of the state determination unit 106 and records the selected updated state variables in the state variable memory unit 109. In this way, whether to discard the variables and symbol data obtained by the processing system including the second arithmetic decoding unit 101 and second re-normalization unit 105 is determined at once based on the determination result of the state determination unit 106. Hence, the decoding apparatus can have a simple arrangement.

When the MSB of the first state variable codIRange' is "1", that is, when the shift amount in the first re-normalization unit 107 is 0, the state determination unit 106 determines that the second symbol data output from the second arithmetic decoding unit 101 is valid. Hence, the state determination unit 106 can be implemented by a very simple arrangement as shown in FIG. 7 or 8 so that the decoding apparatus can have a simple arrangement.

As described above, according to this embodiment, the second arithmetic decoding unit 101 and first arithmetic decoding unit 102 operate in parallel (parallel processing in one clock period). It is determined by using the first state variables output from the first arithmetic decoding unit 102 whether the symbol output from the second arithmetic decoding unit 101 is valid. It is therefore possible to implement an entropy decoding apparatus capable of operating at a high operating frequency and decoding two symbols simultaneously (outputting two symbols in one cycle).

OTHER EMBODIMENTS

An arithmetic decoding apparatus implemented by hardware has been described above. However, an arithmetic decoding apparatus may be implemented by using software. In this case, the above-described parallel operation is implemented by multithreading (multiprocessor).

The object of the present invention is also achieved by causing a computer (or CPU or MPU) to read out and execute program codes stored in a recording medium which records software program codes to implement the functions of the above-described embodiment. For example, the recording medium is supplied to a system or apparatus, and the computer of the system or apparatus reads out and executes the program codes stored in the recording medium. In this case, the program codes read out from the storage medium implement the functions of the above-described embodiment by themselves, and the storage medium which stores the program codes constitutes the present invention.

Examples of the storage medium usable to supply the program codes are a flexible disk, hard disk, optical disk, magnetooptical disk, CD-ROM, CD-R, magnetic tape, nonvolatile memory card, ROM, and DVD.

The functions of the above-described embodiment are implemented not only when the computer executes the read-out program codes but also when the operating system (OS) running on the computer partially or wholly executes actual processing based on the instructions of the program codes.

Alternatively, the program codes read out from the storage medium are written in the memory of a function expansion board inserted into the computer or a function expansion unit connected to the computer. The CPU of the function expansion board or function expansion unit partially or wholly executes actual processing based on the instructions of the program codes, thereby implementing the functions of the above-described embodiment.

According to the present invention, two arithmetic decoding units can output symbols simultaneously. Hence, decoding processing can be done at a higher speed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-298211, filed Nov. 1, 2006, which is hereby incorporated by reference herein in its entirety.

What is claimed is:

1. A decoding apparatus for arithmetically decoding input coded data into symbol data by using a state variable and a context variable, comprising:

a first decoding unit which executes arithmetic decoding processing by using the state variable and the context variable and outputs first symbol data, and outputs the state variable and the context variable, which are updated by the arithmetic decoding processing, as a first state variable and a first context variable;

a second decoding unit which executes arithmetic decoding processing by using the first state variable and the first context variable and outputs second symbol data, and outputs the first state variable and the first context variable, which are updated by the arithmetic decoding processing, as a second state variable and a second context variable;

a determination unit which determines on the basis of a value of the first state variable whether to employ the second symbol data as a decoding result;

a memory unit which stores the state variable and the context variable and provides the state variable and the context variable to said first decoding unit;

a first re-normalization unit which executes re-normalization processing by using the coded data and the first state variable and outputs a first updated state variable;

a second re-normalization unit which executes re-normalization processing by using the coded data and the second state variable and outputs a second updated state variable;

a first selection unit which selects, from the first context variable and the second context variable, a context variable to be stored in said memory unit; and a second selection unit which selects, from the first updated state variable and the second undated state variable, a state variable to be stored in said memory unit, wherein said first selection unit and said second selection unit execute selection on the basis of a determination result of said determination unit.

2. The apparatus according to claim 1, wherein said determination unit determines that the second symbol data should be employed as the decoding result when a shift amount for the first state variable is 0(zero) in re-normalization by said first re-normalization unit.

3. A decoding method of arithmetically decoding input coded data into symbol data by using a state variable and a context variable, comprising:

a first decoding step of executing arithmetic decoding processing by using the state variable and the context variable and outputting first symbol data, and outputting the state variable and the context variable, which are updated by the arithmetic decoding processing, as a first state variable and a first context variable;

a second decoding step of executing arithmetic decoding processing by using the first state variable and the first context variable and outputting second symbol data, and outputting the first state variable and the first context variable, which are updated by the arithmetic decoding processing, as a second state variable and a second context variable;

a determination step of determining on the basis of a value of the first state variable whether to employ the second symbol data as a decoding result;

a first re-normalization step of executing re-normalization processing by using the coded data and the first state variable and outputting a first updated state variable;

a second re-normalization step of executing re-normalization processing by using the coded data and the second state variable and outputting a second updated state variable;

a first selection step of selecting one of the first context variable and the second context variable and storing the selected context variable in a memory unit which stores the state variable and the context variable used in the first decoding step; and a second selection step of selecting one of the first updated state variable and the second updated state variable and storing the selected updated state variable in the memory unit, wherein in the first selection step and the second selection step, selection is executed on the basis of a determination result in the determination step.

4. The method according to claim 3, wherein in the determination step, it is determined that the second symbol data should be employed as the decoding result when a shift amount for the first state variable is 0(zero) in re-normalization in the first re-normalization step.

5. A computer-readable storage medium storing a control program which causes a computer to execute a decoding method of claim 3.

* * * * *